United States Patent
Mayder et al.

(10) Patent No.: US 7,147,499 B1
(45) Date of Patent: Dec. 12, 2006

(54) ZERO INSERTION FORCE PRINTED CIRCUIT ASSEMBLY CONNECTOR SYSTEM AND METHOD

(75) Inventors: Romi Mayder, San Jose, CA (US); John W. Andberg, Santa Cruz, CA (US); Don Chiu, Sunnyvale, CA (US); Noriyuki Sugihara, Campbell, CA (US)

(73) Assignee: Verigy IPco, Singapore (SG)

( * ) Notice: Subject to any disclaimer, the term of this patent is extended or adjusted under 35 U.S.C. 154(b) by 0 days.

(21) Appl. No.: 11/253,446

(22) Filed: Oct. 19, 2005

(51) Int. Cl.
*H01R 13/62* (2006.01)
(52) U.S. Cl. .................. 439/260; 324/754; 324/760
(58) Field of Classification Search .......... 439/260, 439/259, 197; 324/754–755, 761–762
See application file for complete search history.

(56) References Cited

U.S. PATENT DOCUMENTS

| | | | | |
|---|---|---|---|---|
| 6,069,483 A | * | 5/2000 | Maxwell et al. ............ 324/760 |
| 6,744,267 B1 | * | 6/2004 | Sauk et al. .................. 324/754 |
| 6,784,657 B1 | * | 8/2004 | Fujishiro et al. ......... 324/158.1 |
| 6,833,696 B1 | | 12/2004 | Sinsheimer et al. ..... 324/158.1 |

* cited by examiner

Primary Examiner—Michael C. Zarroli

(57) ABSTRACT

In one embodiment, a mating circuit assembly is coupled and decoupled to a system by 1) mechanically and electrically coupling at least a first interposer, mounted on at least one of first and second substrates, to the mating circuit assembly. The mechanical and electrical coupling is accomplished using at least first and second spring mechanisms, with the first and second spring mechanisms being mounted between the connector housing and respective ones of the first and second substrates. At least one of the first and second substrates transmits signals between the first interposer and the system. The first interposer is electrically and mechanically decoupled from the mating circuit assembly by creating a vacuum between the connector housing and at least one of the first and second substrates. Other embodiments are also disclosed.

19 Claims, 5 Drawing Sheets

ZERO INSERTION FORCE PRINTED CIRCUIT ASSEMBLY CONNECTOR SYSTEM AND METHOD

BACKGROUND

The present invention relates to techniques for reliably creating a large number of high-speed electrical connections between two circuit assemblies. More specifically, the present invention provides a variety of techniques for establishing such connections with a high cycle life while requiring a very low externally created force to facilitate the connect-disconnect cycle.

As electronics becomes more dense, higher speed and complex, the force necessary to establish reliable connections between circuits, especially in semiconductor test systems, is becoming more and more difficult. Moreover, interconnect methods that rely on high contact forces and metal to metal abrasion lower the cycle life due to damage caused to the metal plating on the electrical contacts of the circuit assemblies. This is of particular concern with zero insertion force (ZIF) connectors and test heads used in semiconductor testers, such as the Agilent Technologies, Inc. V5400 and V5500 testers. A typical test head may have thirty-six zero insertion force connectors between the PEF-PIF boards on the PE modules and the edge cards on a probe card.

Some conventional zero insertion force connector systems are plagued by electrical connectivity issues due to non-uniform force applied to each of the individual contact elements. Several conventional connector systems use flexible substrates to compensate for mechanical dimensional tolerances of the mating circuit assembly. However, the suppleness of the flexible substrate is directly related to the reciprocal of the electrical performance of the contact between the two circuit assemblies. As the electrical performance of the substrate improves, the mechanical flexibility decreases. This limits the dimensional pitch between the individual electrical contact elements.

Accordingly, there is a need for a zero insertion force printed circuit board connector system with reliable electrical connectivity and uniform force applied to individual contact elements.

BRIEF DESCRIPTION OF THE DRAWINGS

An understanding of the present teachings can be gained from the following detailed description, taken in conjunction with the accompanying drawings of which.

DETAILED DESCRIPTION

Figure 1:
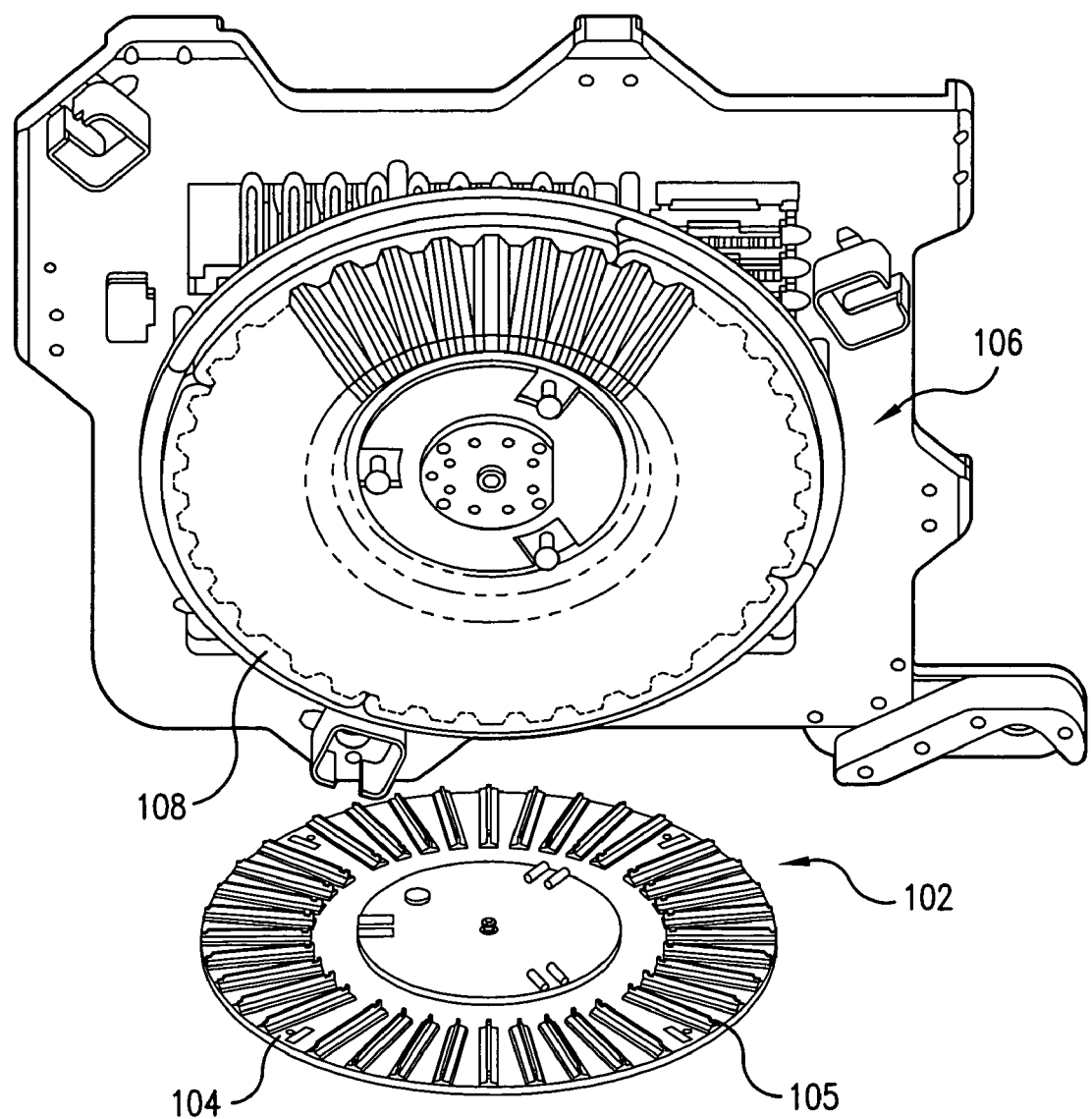
FIG. 1 illustrates a perspective view of a connector between a test head and a device under test (DUT) board.

FIG. 1 illustrates a high-speed connection assembly 100 for establishing a large number of high-speed connections between at least one device under test and automatic test equipment (not shown), such as an ZIF connector for use between a DUT board and a V5400 or a V5500 test head. A DUT assembly 102 is provided on the underside of which are large number of electrical contacts (not shown) to one ore more DUTs. Such electrical contacts might be, for example, probe needles if DUT assembly 102 is a probe card for use in wafer sort, or sockets if DUT board 102 is a contactor board for use in package test. The primary function of DUT assembly 102 is to translate electrical signals out of the plane of board 104 so that they are accessible to the connection mechanism, i.e., interface connection assembly 106.

An exemplary high-speed connector is taught in U.S. Pat. No. 6,833,696 entitled "Methods and Apparatus for Creating a High Speed Connection Between A Device Under Test And Automatic Test Equipment", by Roger Sinsheimer et al. An exemplary automatic test equipment is the V5400 or V5500 by Agilent Technologies, Inc. of Palo Alto, Calif. High-speed connection assembly 100 may include a DUT assembly 102 for translating electrical signals from a board 104 via a plurality of connector circuits 105 to a connection mechanism 106 with a plurality of clamping connectors 108 radially disposed around the connection mechanism to align with connector circuits 105 on the DUT assembly 102.

Figure 2:
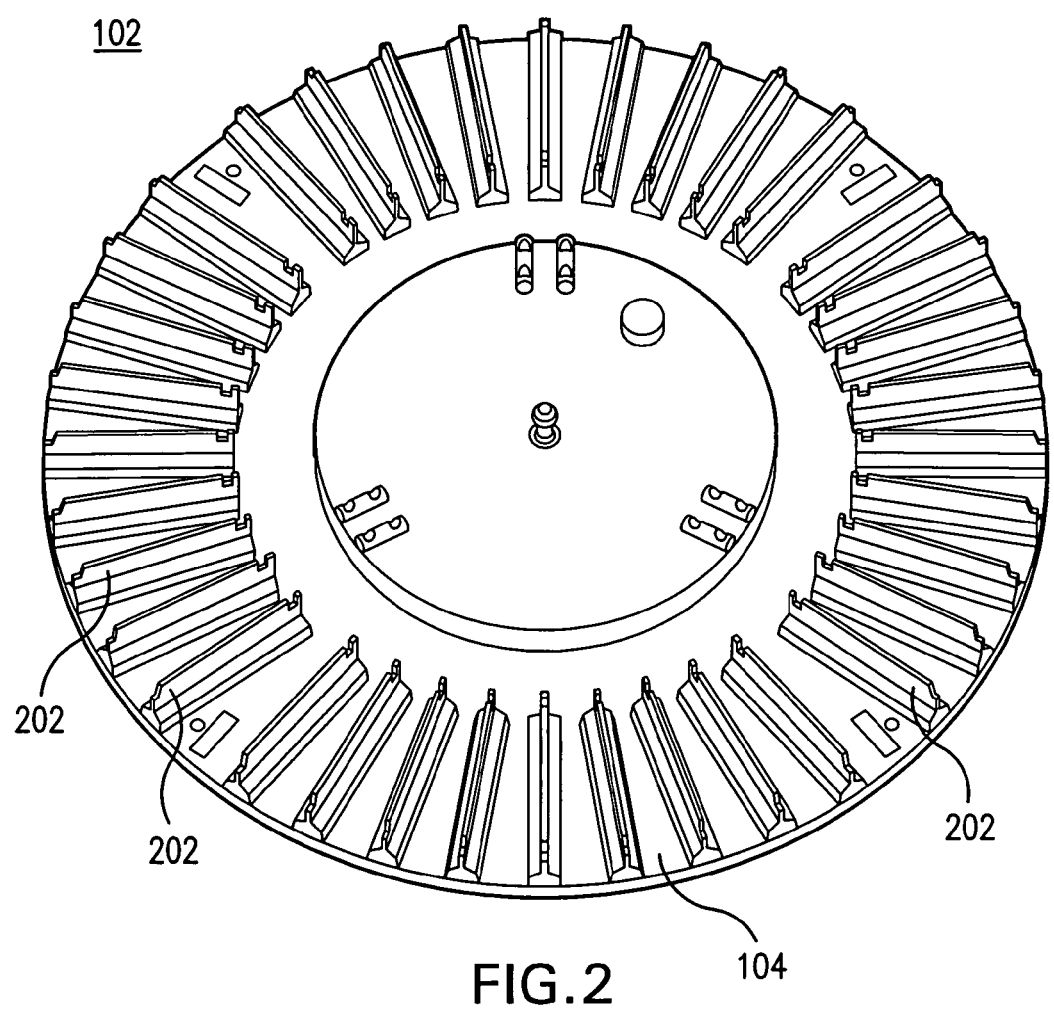
FIG. 2 illustrates a close-up perspective view of a DUT board of FIG. 1.
Figure 3:
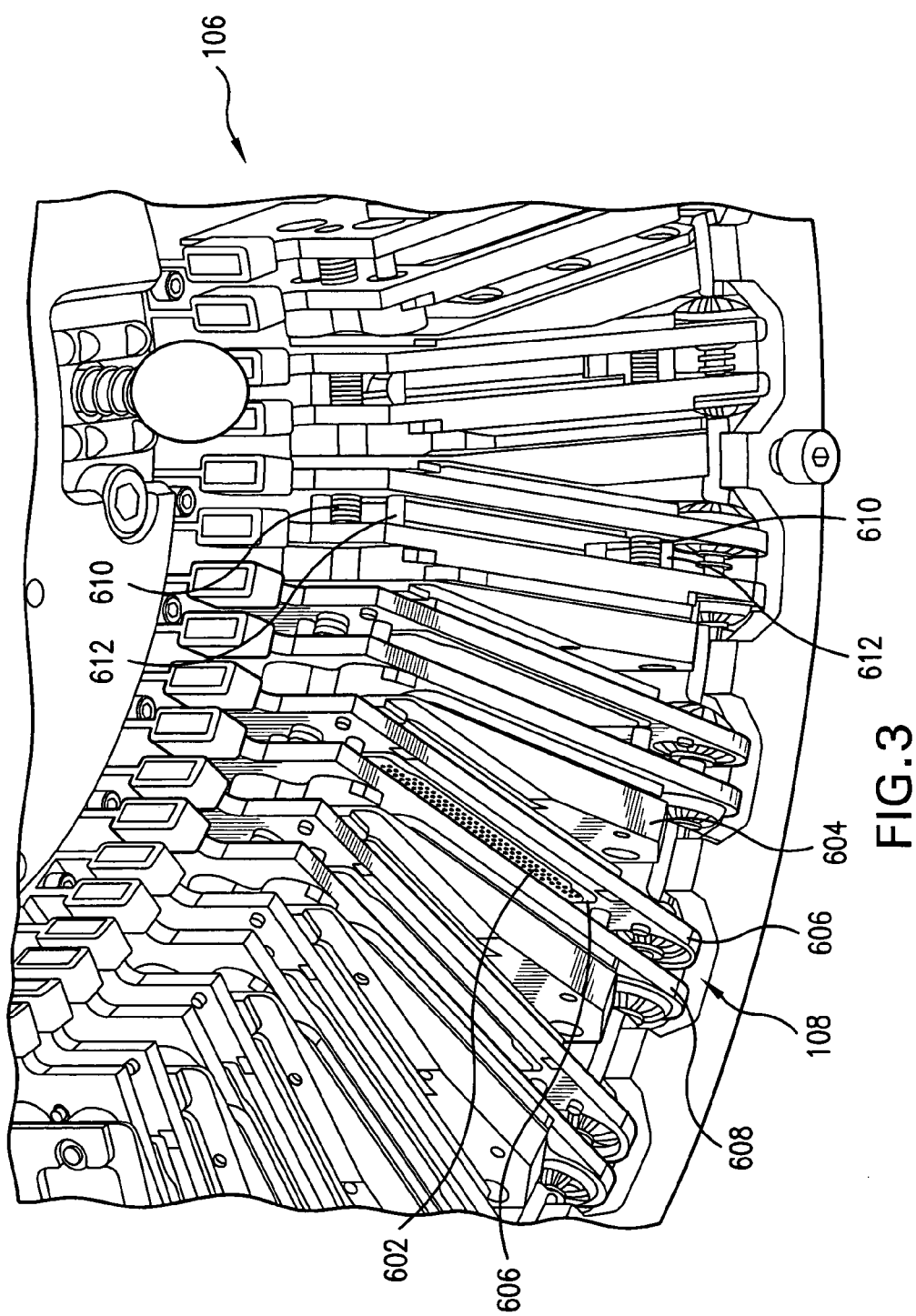
FIG. 3 illustrates a closer view of a DUT board assembly of FIG. 1 showing detailed features of a plurality of mating board assemblies disposed thereon.

Referring to FIG. 2, an exemplary DUT assembly 102 may have a plurality of mating printed circuit boards 202 disposed radially on the DUT board 104 which facilitate signal translation. FIG. 3 shows a close-up view of a portion of an exemplary interface connection assembly 106 with clamping connectors 108 that comprise opposing clamp plates 608 with contacts 602 on inner walls 606 of clamp plates 608. In the prior art, the clamping and release actions for clamp plates 608 are actuated by pneumatic shafts, cylinders or bladders 612 at either end of the clamp plates 608. There are springs 610 that work against the clamping cylinders 604 to keep the clamping plates 608 apart.

Figure 4:
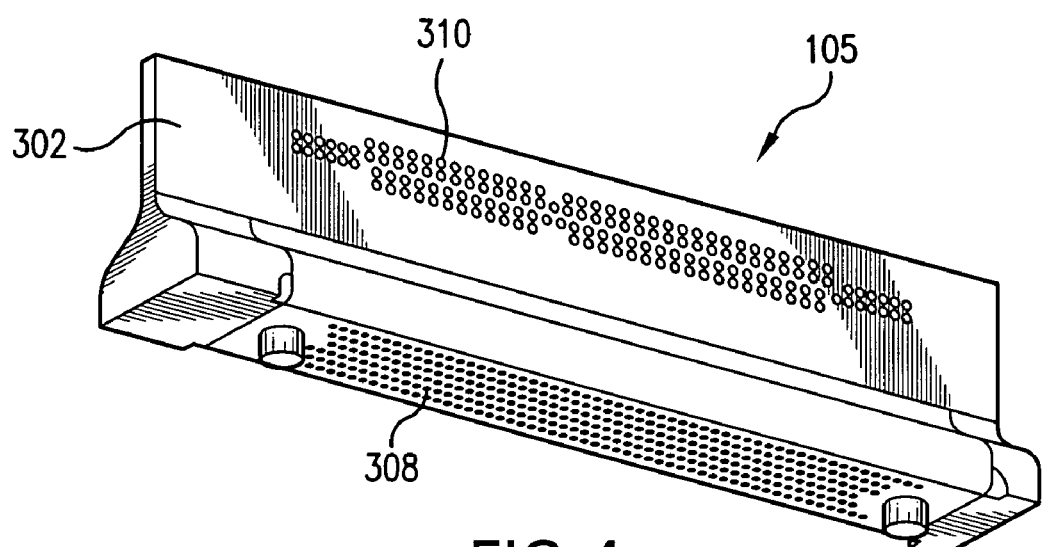
FIG. 4 illustrates a close-up view of the connector assembly of FIG. 1 showing detailed features of a plurality of clamping assemblies of which the connector assembly is comprised.

FIG. 4 illustrates a blown-up view of one of the connector circuits 105, which may comprise a mating printed circuit board 302 with contacts 310 on one or both sides and contacts 308 at the bottom of the assembly to mate with corresponding contacts (not shown) on the surface of board 104 when the connector circuit 105 is secured in place on board 104.

Figure 5:
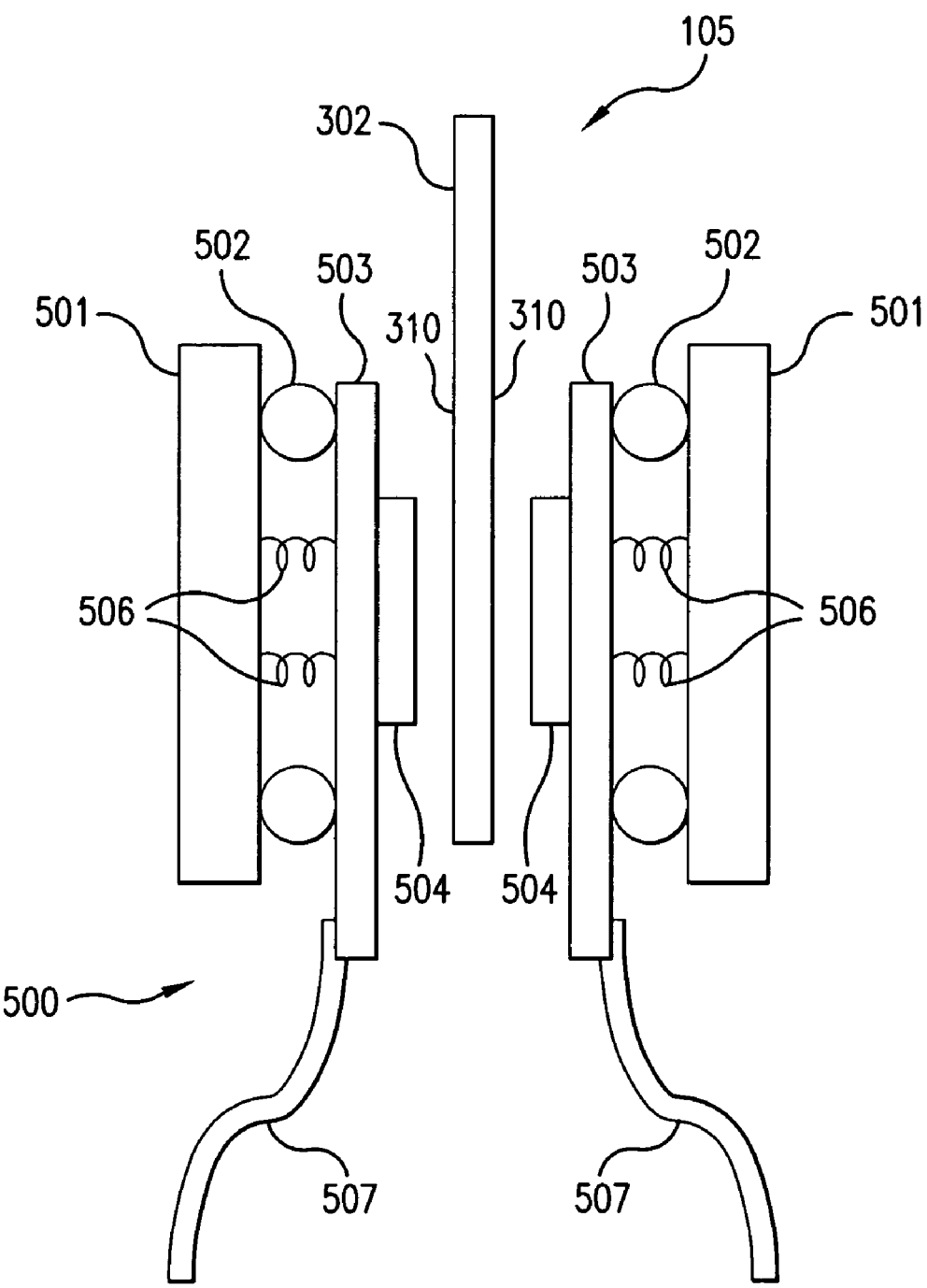
FIG. 5 illustrates a closer view of a clamping assembly of FIG. 4 and a partial view of a mating board in accordance with the invention.

Referring now to FIG. 5, a zero insertion force connector system according to the invention is shown. Specifically, an overall connector clamp housing 501 of the zero insertion force connector system is comprised of a material that will support the contact force necessary to compress all the individual contact elements. For example, connector clamp housing 501 may be made of non-magnetic stainless steel 300 series; aluminum; case hardened 440 stainless steel; case hardened BeCu; or a similar material or composite.

One or more electrical contact substrates 503 are mounted within the connector clamp housing 501. The electrical contact substrate 503 may comprise Rogers 4350; Nelco 4000-13 SI; standard FR-4; high temperature FR-4; Rogers 3000; or other similar materials or composites. Passive or active components may be mounted on the electrical contact substrate 503. Directly behind the electrical contact substrates 503 and located between the connector clamp housing 501 and the electrical contact substrates 503 are several mechanical spring elements 506, which apply the force necessary to compress the electrical contact substrates 503. The mechanical spring elements 506 may comprise musical wire; BeCu; non-magnetic 300 stainless steel; coil (belville or wave); silicone rubber (solid or foam) or any similar mechanical spring type elements.

Around the perimeter of each electrical contact substrate 503 is a vacuum seal 502 that is actuated to unclamp the electrical contact substrates 503. The vacuum seals may be hollow O-rings; standard O-rings; lip seals; bellows; vacuum cylinder or other similar vacuum sealing mechanism. The electrical contact substrate 503 is electrically connected to the mating printed circuit board 302 by using a board-to-board interconnect 504. Through out this document, the phrase board-to-board interconnect is used interchangeably with the phrase interposer. The board-to-board interconnect or interposer 504 may be made of a Neoconix stamped metal spring laminated to PCB; KnS leaf spring made with a wire bond machine; Intercom C-stack; HCD super spring; HCD super button or other similar material. The interposer 504 may have individual electrical contact elements (602 in FIG. 3) for making electrical contact with the individual electrical contact elements 310 on the mating printed circuit board 302. Alternatively, the interposer 504 may be a Z-axis conductive member, such as a sheet of rubber or other insulating material with wires or other conductive features embedded therein perpendicular to the plane of the insulating material. This design would be instead of electrical contact elements 602.

Mating printed circuit board 302 is aligned to the connector system 500 by guide pins or other features (not shown) located in the connector housing 501 or larger system that the connector housing is mounted on, such as a test head (not shown). The mating circuit board 302 may be made of Rogers 4350; high temperature FR-4; standard FR-4; Nelco 4000-13 SI; flex circuit wrapped over molded, machined plastic; or other similar material. The electrical signal may flow from the mating printed circuit board 302, through the board-to-board interconnect 504, into the electrical contact substrate 503 and then through a signal transfer members 507, such as coaxial cable, to and from a target system or device, such as a memory tester (not shown). The signal transfer members 507 may be ribbonized RG178; tempflex low Dk coaxial cable; goretex tape wrapped coaxial cable; tensolite standard braid coaxial cable; tempflex serve shielded coaxial cable or other similar signal transfer means.

The electrical signals may also flow in the opposite direction as well. This connector system may be mated and unmated several thousand times without significant degradation to the contact resistance. Ribbonized coaxial cables 507 may or may not be mass terminated to the electrical contact substrate 503 by using hot bar process to minimize manufacturing costs. The connector system may be two sided, but may also be one sided either for the vacuum actuation or the contact substrate. In a one-sided case, another member or element may move the stationary jaw to allow insertion of the mating printed circuit board 302.

One application for this connector system 500 is for use as a DUT interface or probe card interface in a high pin count memory test system, such as the Agilent Technologies, Inc. V5400 or V5500 memory test system. However, this connector system 500 may be used in other systems requiring connecting and disconnecting large numbers of signal paths between printed circuit boards.

Improved RF performance may be achieved with the connector system 500 of the present invention by using a rigid printed circuit board for the contact substrate 503. Improved mechanical compressive force may be achieved behind each electrical contact substrate 503 by using an interposer or board-to-board interconnect 504. Improved mechanical repeatability and reliability is achieved by actuating the connector system 500 using a vacuum mechanism 502.

In prior connectors, if the electrical performance of the ZIF connector was improved, the electrical performance would be decreased and vice versa. Prior solutions used a combined interposer and printed circuit board into a flex circuit with gold bumps (see U.S. Pat. No. 6,833,696), in which improving mechanical contact of the gold bumps required the flex circuit to be thinner, which decreased the electrical performance. Conversely, to increase the electrical performance, the flex circuit would need to be thicker, which would compromise the mechanical flexibility of the substrate, and thus decrease the mechanical performance.

The present zero insertion force connector system 500 decouples the relationship between the electrical performance of the contact substrate 503 and the mechanical force applied to each electrical contact element 602. The present invention uses a rigid printed circuit board 503 and a separate interposer or board-to-board interconnect 504, each piece can be optimized individually and the electrical performance is improved and the mechanical loading is more uniform for each electrical contact element 602. Clamping action is supplied by one or several spring members 506, sized to provide uniform and sufficient clamping force. A vacuum 502 is used to unclamp the connector 500 and retract the contact substrate 503 and the interposer 504.

Some implementations may include active or passive circuitry on the mating printed circuit board 302. Some implementations of the connector system 500 may or may not require motion of the contact substrates 503 with active circuitry to achieve clamping action. Active circuits may be mounted inside the ZIF connector housing on the printed circuit board. Prior flex circuit solutions do not permit soldering of semiconductor devices or other components to the flex circuit, because the flex circuit would no longer be flexible. In some implementations, a contact substrate 503 may be stationary with the mating circuit assembly moving to actuate the mating and demating processes.

As shown in FIGS. 1 and 3, many zero insertion force connector systems 500 may be mounted on a test head 106 in order to enable connections between a tester (not shown) and a DUT card or probe card 102. In such a case, there may be many vacuum seals 502 simultaneously actuated to ensure that all the connectors 500 on the test head are actuated and deactuated simultaneously. Such a connector system enables a machine, such as a memory testor to be programmed for different tasks by switching out a card or board with complex electronics on it that enables different features of the machine. One such use enables a memory testor to be used in wafer sort to test wafers by making connections between the test head and mating printed circuit boards on a probe card and then to test chips by making connections between the test head and mating printed circuit boards on a DUT card. The present invention overcomes of prior mating connectors that either deteriorated the electrical contact elements on the mating printed circuit board or the contacts of the connector, made unreliable connections or the quality of the connections deteriorated after many connections.

As will be appreciated by those in the art, the circular layout of the test head and probe card or DUT card may be another physical layout other than circular, such as rectilinear, linear, etc.

The invention claimed is:
1. A zero insertion force connector system for making electrical contact with a mating circuit assembly, the zero insertion force connector system comprising:
   a connector housing;
   first and second opposing substrates;
   at least one interposer mounted on at least one of the first and second opposing substrates, between the first and second opposing substrates;
   a first spring mechanism i) coupling the first opposing substrate to the connector housing, and ii) biasing the first opposing substrate toward or away from the second opposing substrate;
   a first vacuum seal coupling the first opposing substrate and the connector housing and defining a first vacuum cavity;
   a first vacuum actuator, connected to the first vacuum cavity, to alternately i) allow the first spring mechanism to bias the first opposing substrate toward or away from the second opposing substrate, thereby causing the at least one interposer to electrically and physically mate or unmate with the mating circuit assembly, and ii) create or destroy a vacuum in the first vacuum cavity to override the bias of the first spring mechanism; and
   one or more signal transmission means connected to at least one of the first and second opposing substrates.

2. The zero insertion force connector system according to claim 1, wherein the one or more signal transmission means comprises one or more coaxial cables.

3. The zero insertion force connector system according to claim 1, wherein the zero insertion force connector system is part of a test head of a tester system.

4. The zero insertion force connector system according to claim 1, wherein the zero insertion force connector system is one of a plurality of connectors on tester system.

5. The zero insertion force connector system according to claim 1, wherein the first and second opposing substrates comprise one or more rigid members.

6. The zero insertion force connector system according to claim 1, wherein the first spring mechanism is a mechanical spring element.

7. The zero insertion force connector system according to claim 6, wherein:
   the first spring mechanism biases the first opposing substrate toward the second opposing substrate; and
   the vacuum created by the first vacuum actuator biases the first opposing substrate away from the second opposing substrate.

8. The zero insertion force connector system according to claim 1, wherein the connector housing is circular.

9. The zero insertion force connector system according to claim 1, wherein the mating circuit assembly is a printed circuit board.

10. A zero insertion force connector system for making electrical contact with a mating circuit assembly, the zero insertion force connector system comprising:
   a connector housing;
   first and second opposing members including i) a stationary jaw, fixed to the connector housing, and ii) a movable substrate;
   at least one interposer mounted on at least one of the first and second opposing members, between the first and second opposing members;
   a first spring mechanism i) coupling the movable substrate to the connector housing, and ii) biasing the movable substrate toward or away from the stationary jaw;
   a first vacuum seal coupling the movable substrate and the connector housing and defining a first vacuum cavity;
   a first vacuum actuator, connected to the first vacuum cavity, to alternately i) allow the first spring mechanism to bias the movable substrate toward or away from the stationary jaw, thereby causing the at least one interposer to electrically and physically mate or unmate with the mating circuit assembly, and ii) create or destroy a vacuum in the first vacuum cavity to override the bias of the first spring mechanism; and
   one or more signal transmission means connected to the at least one interposer via the stationary jaw or movable substrate.

11. The zero insertion force connector system according to claim 10, wherein the first and second opposing members comprise one or more rigid members.

12. The zero insertion force connector system according to claim 10, wherein the first spring mechanism is a mechanical spring element.

13. The zero insertion force connector system according to claim 12, wherein:
   the first spring mechanism biases the first opposing member toward the second opposing member; and
   the vacuum created by the first vacuum actuator biases the first opposing member away from the second opposing member.

14. The zero insertion force connector system according to claim 10, wherein the one or more signal transmission means comprises one or more coaxial cables.

15. The zero insertion force connector system according to claim 10, wherein the zero insertion force connector system is part of a test head of a tester system.

16. The zero insertion force connector system according to claim 10, wherein the zero insertion force connector system is one of a plurality of connectors on tester system.

17. The zero insertion force connector system according to claim 10, wherein the connector housing is circular.

18. The zero insertion force connector system according to claim 10, wherein the mating circuit assembly is a printed circuit board.

19. A method for coupling and decoupling a mating circuit assembly to a system, the method comprising:
   mechanically and electrically coupling at least a first interposer, mounted on at least one of first and second substrates, to the mating circuit assembly, wherein the mechanical and electrical coupling is accomplished using at least first and second spring mechanisms, wherein the first and second spring mechanisms are mounted between a connector housing and respective ones of the first and second substrates, and wherein at least one of the first and second substrates transmits signals between the first interposer and the system; and
   mechanically and electrically decoupling at least the first interposer from the mating circuit assembly by creating a vacuum between the connector housing and at least one of the first and second substrates.

* * * * *